United States Patent [19]

Palara et al.

[11] Patent Number: 4,638,507
[45] Date of Patent: Jan. 20, 1987

[54] AUDIO AMPLIFIER SWITCH-ON CONTROL CIRCUIT

[75] Inventors: Sergio Palara, Bareggio; Aldo Torazzina, Monza, both of Italy

[73] Assignee: SGS-ATES Componenti Elettronici S.p.A., Catania, Italy

[21] Appl. No.: 722,386

[22] Filed: Apr. 12, 1985

[30] Foreign Application Priority Data

Apr. 20, 1984 [IT] Italy ............................... 20645 A/84

[51] Int. Cl.$^4$ ............................................. H03F 1/26
[52] U.S. Cl. ...................................... 381/94; 381/120
[58] Field of Search ................... 358/28, 94, 120, 123; 455/297, 298; 330/297, 137, 141

[56] References Cited

U.S. PATENT DOCUMENTS

| | | | |
|---|---|---|---|
| 3,965,295 | 6/1976 | Evans | 381/123 |
| 4,339,730 | 7/1982 | Yokoyama | 330/297 |
| 4,441,086 | 4/1984 | Karlow | 381/94 |
| 4,448,074 | 5/1984 | Schmidt | 381/123 |
| 4,453,264 | 6/1984 | Hochstein | 381/123 |
| 4,472,687 | 9/1984 | Kashiwagi | 330/297 |
| 4,502,016 | 2/1985 | Siligoni | 381/120 |

Primary Examiner—Gene Z. Rubinson
Assistant Examiner—L. C. Schroeder
Attorney, Agent, or Firm—Cushman, Darby & Cushman

[57] ABSTRACT

A capacitor which is progressively chargeable in response to a switching on of the equipment, however brought about, is associated with an oscillating circuit with intervention threshold. As the load voltage of said capacitor increases the oscillating circuit shifts from a first to a second operating state, generating a switch-on current for the audio amplifier. The latter can be placed in stand-by condition by discharging to earth said capacitor by means of a suitable switch.

11 Claims, 7 Drawing Figures

AUDIO AMPLIFIER SWITCH-ON CONTROL CIRCUIT

BACKGROUND OF THE INVENTION

The present invention concerns an audio amplifier switch-on control circuit.

It is known that in audio, TV and radio equipment, interference can be produced, upon switching on, at the audio amplifier outlet, that is in the loudspeaker, due to settling defects in the upstream circuits. Such disturbances are commonly called "switch-on noise".

This inconvenience can be overcome by using a so-called "muting" circuit, which controls the switch-on time of the audio amplifier so as to make it become dynamic only after the circuits upstream have duly settled. In other words, the audio amplifier is "muted", and the input audio signal is prevented from reaching the loudspeaker, as long as the circuits upstream remain in a condition such as to generate switch-on noise.

It is also known that in such equipment a "stand-by" function is sometimes provided, in which the equipment is held in a waiting condition with minimum absorption, which allows subsequent turning on again of the power part by nonpower telecontrol or switch. Switching on again after "stand-by" must naturally take place without noise production, that is with an appropriate delay in audio amplifier switch-on time.

The primary object of the present invention is to accomplish an audio amplifier control circuit capable of appropriately delaying the audio amplifier switch-on time upon each new switching on of the equipment, however controlled.

Another object of the present invention is to accomplish an audio amplifier control circuit also capable of causing switching off, and then correct switching on again, of the audio amplifier after a "stand-by" command.

SUMMARY OF THE INVENTION

In view of these objects, the control circuit according to the invention is characterized in that it includes a progressively loadable capacitor in response to the switching on of the equipment and an oscillating circuit with intervention threshold, which responds to the increase in load voltage of said capacitor beyond a preset value in such a way as to move progressively from a first to a second operating state for the generation of a switch-on current for the audio amplifier.

It appears evident that the time necessary for the load voltage of the capacitor to reach first the intervention threshold of the oscillating circuit and then carry the circuit into the second operating state represents the switch-on delay of the audio amplifier after the instant the equipment is switched on. This delay time can of course be selected so as to be certainly greater than the time necessary for the settling of the circuits which generate the audio signal. The bothersome switch-on noise is thus avoided.

The control circuit according to the invention also makes possible turning off of the audio amplifier, with a resulting reduced current absorption, following a stand-by command.

To accomplish this it is sufficient to short circuit and hence discharge to earth (or ground), by means of an appropriate switch, the capacitor which controls the oscillating circuit. By so doing, the oscillating circuit is caused to return to the initial state, taking away switching-on current from the audio amplifier and thereby causing it to be extinguished.

Upon switching on again after stand-by, that is upon reopening of the aforesaid switch, the capacitor can also recharge itself and return, with the usual preset time delay, the oscillating circuit to the state of generation of the switch-on current for the audio amplifier.

DESCRIPTION OF THE DRAWINGS

These and other characteristics of the present invention will be made evident by the following detailed description of two possible forms of practical accomplishment illustrated as examples in the annexed drawings, wherein.

DESCRIPTION OF THE PREFERRED EMBODIMENT

Figure 1:
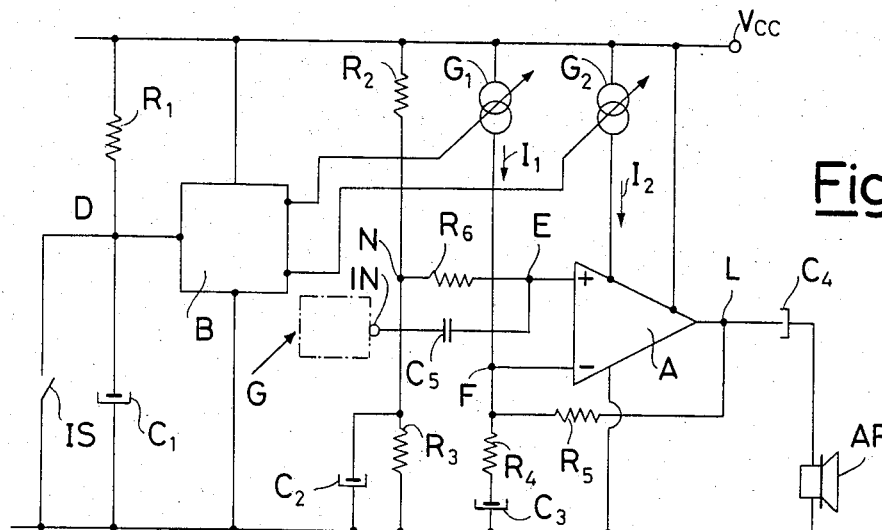
FIG. 1 shows a control circuit according to the invention, associated with an audio amplifier with individual power supply.

With reference to FIG. 1, A indicates an audio amplifier equipped with a positive input E, a negative input F and an output L for control of a loudspeaker AP. A feedback circuit between output L and input F includes a resistance $R_5$. A capacitor $C_4$ is inserted between the output L and the loudspeaker AP.

The positive input E is connected by a resistance $R_6$ to a circuital node N connected to the main power supply $V_{cc}$ and to earth by a resistance $R_3$ having a capacitor $C_2$ in parallel.

The input E is also connected by a capacitor $C_5$ to an audio signal input IN, to which arrives the audio signal processed by the upstream circuits, generally represented and indicated by GS.

The negative input F is in turn connected to the power supply $V_{cc}$ through a current generator $G_1$ which generates a current $I_1$, and an earth through the series of a resistance $R_4$ and a capacitor $C_3$.

Switching on of the amplifier A is provided for by a current generator $G_2$, which generates a switch-on current $I_2$.

Current generators $G_1$ and $G_2$ are controlled by a circuital block B, which in turn is controlled by the voltage in a circuital node D connected to the power supply $V_{cc}$ through a resistance $R_1$ and an earth through a capacitor $C_1$. In parallel with the latter is indicated a stand-by switch IS.

Figure 2:
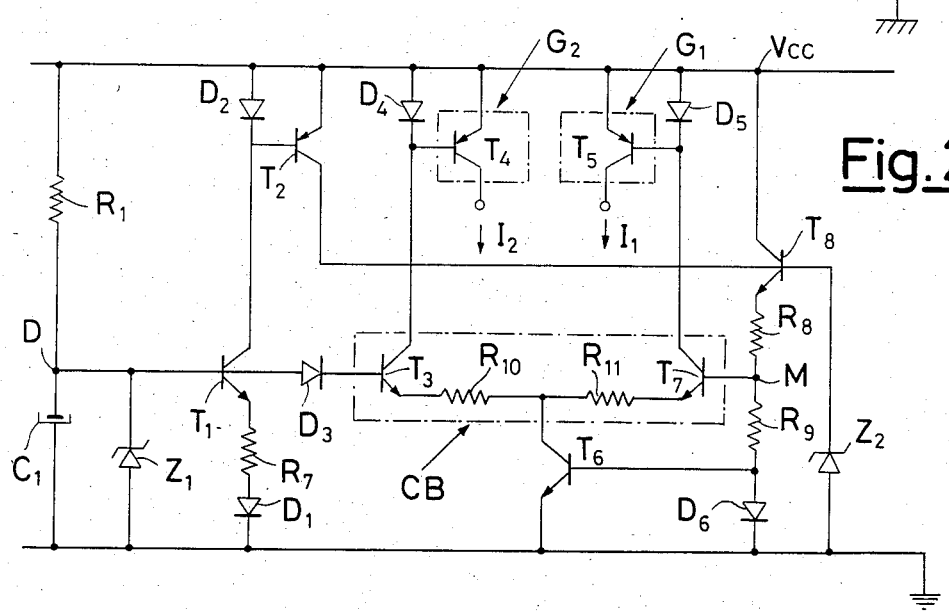
FIG. 2 shows in greater detail the control circuit of FIG. 1.

A more detailed illustration of the circuital block B, as well as the generators $G_1$ and $G_2$ controlled by it, is given in FIG. 2, in which it is seen that circuital node D is connected to the base, connected to earth by a zener diode $Z_1$, of an n-p-n transistor $T_1$ emitter of which is connected to earth through the series of a resistance $R_7$ and a diode $D_1$ and the collector connected to the positive power supply $V_{cc}$ through a diode $D_2$.

The collector of transistor $T_1$ is also connected to the base of a p-n-p transistor $T_2$, the emitter of which is connected to the power supply $V_{cc}$ and the collector connected to the base of an n-p-n transistor $T_8$, the collector of which is connected to the power supply $V_{cc}$, the base connected to earth through a zener diode $Z_2$ and the emitter connected to earth through the series of two resistances $R_8$ and $R_9$ and a diode $D_6$.

The base of transistor $T_1$ and a circuital node M intermediate between the two resistances $R_8$ and $R_9$ are connected, the first through a diode $D_3$ and the second directly, to the bases of their respective n-p-n transistors $T_3$ and $T_7$, which together form an oscillating circuit CB shiftable from one to the other of two operating states under the control of the voltages in nodes D and M.

More precisely, the two transistors $T_3$ and $T_7$ have their respective emitters connected through equal resistances $R_{10}$ and $R_{11}$ to the collector of an n-p-n transistor $T_6$, the emitter of which is connected to earth and the base of which is connected to earth and of which the base is connected to a node intermediate between resistances $R_9$ and diode $D_6$. The collectors of transistors $T_3$ and $T_7$ are also connected to the positive power supply $V_{cc}$ through their respective diodes $D_4$ and $D_5$.

To the collectors of transistors $T_3$ and $T_7$ are also connected the bases of their respective p-n-p transistors $T_4$ and $T_5$, the emitters of which are connected to the power supply $V_{cc}$ and perform the functions of the current generators $G_2$ and $G_1$ of FIG. 1, emitting the respective collector currents $I_2$ and $I_1$.

Figure 3:
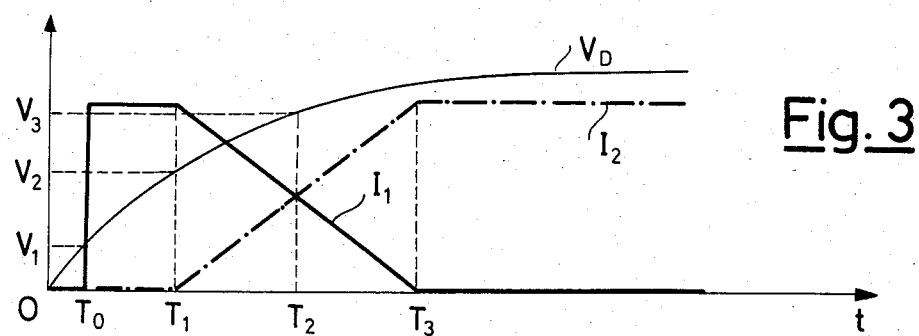
FIGS. 3-5 show curves representing voltage and current variation in time in the control circuit of FIGS. 1 and 2.
Figure 4:
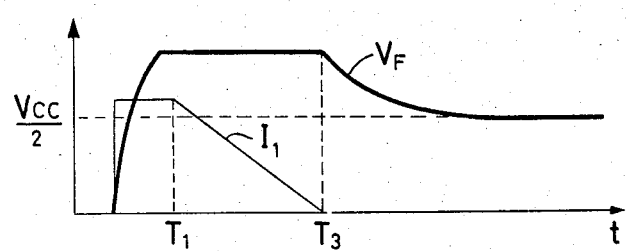
Figure 5:
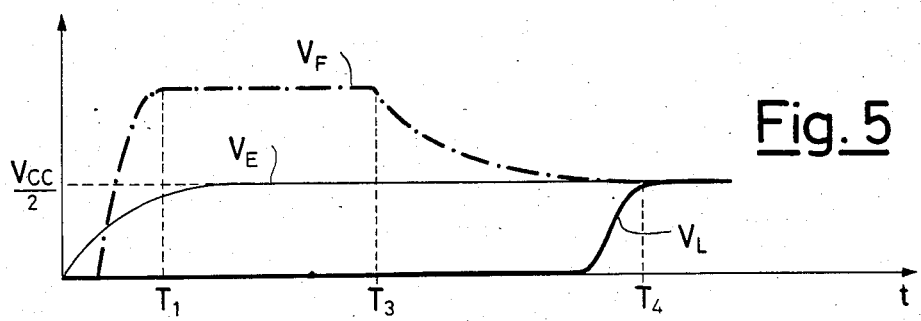

The manner of operation of the control circuit of FIGS. 1 and 2 can be understood with the help of the illustrative charts shown in FIGS. 3–5. As shown in FIG. 3, from the moment of switching on of the equipment (t=0) the positive power supply $V_{cc}$ causes through resistance $R_1$ the gradual charging of capacitor $C_1$ and the consequent increase in the charging voltage $V_D$ (voltage in circuital node D) in accordance with the exponential curve shape shown in said figure. As long as $V_D$ remains below an intervention threshold represented by a value $V_1$ equal to the sum of the voltages $V_{BE}$ (base-emitter voltage) of the transistor $T_1$ and the diode $D_1$ the control circuit remains cut off and with it the audio amplifier A.

At the moment when $V_D=V_1$ occurs (instant $T_0$ in FIG. 3), $T_1$ is placed in conduction and through the mirror $D_2$, $T_2$ causes switching on of the zener $Z_2$ and the consequent conduction of transistor $T_8$. In node M is therefore established a steady voltage $V_M$, which puts the oscillating circuit CB in a first operating state in which transistor $T_3$ is cut off and transistor $T_7$ conducts, causing through $D_5$, $T_5$ the generation of a substantially constant current $I_1$. The current $I_2$ is substantially nil, transistor $T_4$ being of course cut off.

As capacitor $C_1$ continues to be charged, when the charging voltage $V_D$ (instant $T_1$ in FIG. 3) reaches a value $V_2$ equal to $V_M$ less the voltage $V_{BE}$ of transistor $T_7$ and the voltage drop on $R_{11}$, plus the voltages $V_{BE}$ of transistor $T_3$ and diode $D_3$, transistor $T_3$ goes gradually into conduction, subtracting current from transistor $T_7$ and also causing through $D_4$, $T_4$ the generation of a current $I_2$, which increases in the same way that $I_1$ decreases, keeping the relation $I_1+I_2$=constant. The two currents, whose curve shape is shown in graphs $I_1$ and $I_2$ of FIG. 3, will be equal when $V_D$ reaches a value $VL_3$ equal to $V_M$ plus the $V_{BE}$ of diode $D_3$ (instant $T_2$ in FIG. 3).

As $V_D$ continues to increase, transistor $T_7$ goes gradually into cutoff, while $T_3$ reaches maximum conduction, and the oscillating circuit CB is consequently shifted into a second operating state in which $I_1$ is nil and $I_2$ has reached the maximum value shown in FIG. 3 (instant $T_3$).

The described variation of currents $I_1$ and $I_2$ under the control of the circuital block B causes the following behaviour of the audio amplifier A in response to the switching on of the equipment.

The current generator $G_1$ is connected to the inverting input F of the amplifier A and starting from instant $T_0$ charges with current $I_1$ gain capacitor $C_3$ up to a maximum value which remains substantially constant until the moment (instant $T_3$) when current $I_1$ is cancelled and capacitor $C_3$ consequently discharges progressively on resistance $R_5$, tending toward the value $V_{cc/2}$. The voltage curve ($V_F$) to the above inverting input is shown in FIG. 4.

The current generator $G_2$, which is assigned to switching on of the amplifier A, remains off until instant $T_1$, consequently keeping the audio amplifier cut off. From instant $T_1$ it begins to deliver a progressively increasing current $I_2$, which gradually causes switching on of the amplifier, completing it at instant $T_3$.

In the meantime however, as shown in FIG. 5, the inverting input F of the amplifier A was held at a voltage $V_F$ higher than that ($V_E$) created by the noninverting input E from the polarization group $R_2$, $R_3$, $R_C$ (appropriately selected). Even with the amplifier switched on, the output voltage $V_L$ of the audio amplifier therefore remains nil and there is no signal at the loudspeaker AP.

As shown in FIG. 5, voltage $V_L$ rises to a higher level only when voltage $V_F$ at the inverting input F falls to the level of voltage $V_E$ at the noninverting input E, that is at instant $T_4$. From that moment onward the audio amplifier begins to deliver current to the load, that is to the loudspeaker AP.

The audio amplifier then becomes dynamic with a time delay $T_4$ after the instant the equipment is switched on. For all of this time the loudspeaker does not receive signals and hence does not produce sound. The upstream circuits, which generate the audio signal for the input IN, thus have time to settle.

As already mentioned, the control circuit of FIGS. 1 and 2 also provides for the possibility of placing the audio amplifier A, and the control circuit itself, in standby condition, that is in minimum current absorption condition. To achieve this it is sufficient to close the switch IS of FIG. 1, so as to bring about the discharge to earth of capacitor $C_1$. As can be understood by observing FIG. 2, this causes the immediate cut-off of transistor $T_1$, and hence of transistor $T_8$, with the consequent return of the oscillating circuit CB to neutral position with both transistors $T_3$ and $T_7$ cut off and currents $I_1$ and $I_2$ of zero value. The audio amplifier A is thus cut off, as is the control circuit associated with it.

Upon reopening of the switch IS, that is upon switching on again after stand-by, capacitor $C_1$ begins to recharge and the cycle described for delayed switching on again of the audio amplifier is repeated. Even in case of switching on again after stand-by, the transfer of the audio signals to the loudspeaker AP through the audio amplifier A is then delayed for the time necessary for the resettling of the audio signal generator circuits.

The control circuit shown in FIGS. 1 and 2 is suitable for the case of an audio amplifier with individual power supply.

With two power supplies ($+V_{cc}$; $-V_{cc}$) the control circuit may become simpler, and in particular generator $G_1$ and current $I_1$ can be eliminated. The control circuit can become as shown in FIG. 6 and the circuital block B can be simplified by directly connecting the collector of transistor $T_7$ to the power supply $V_{cc}$ and eliminating $D_5$ and $T_5$.

Figure 6:
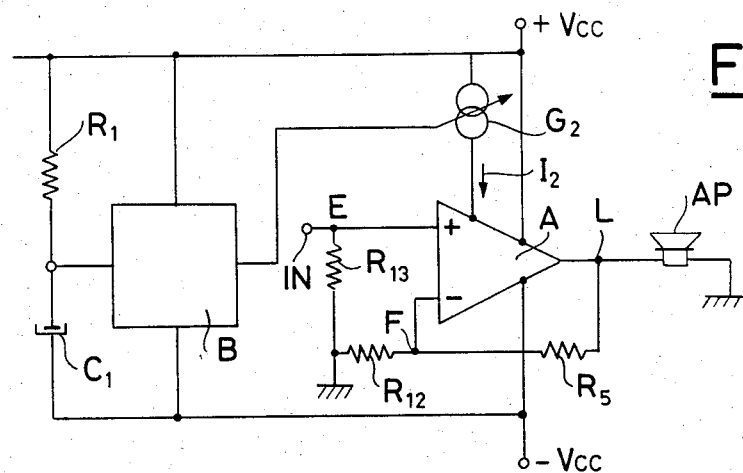
FIG. 6 shows a variant of the control circuit according to the invention, planned for use with an audio amplifier with double power supply.

As shown in FIG. 6 the inverting input F of the audio amplifier is connected to earth through a resistance $R_{12}$ and the noninverting input of the amplifier is connected directly to the input IN and to earth through a resistance $R_{13}$.

Figure 7:
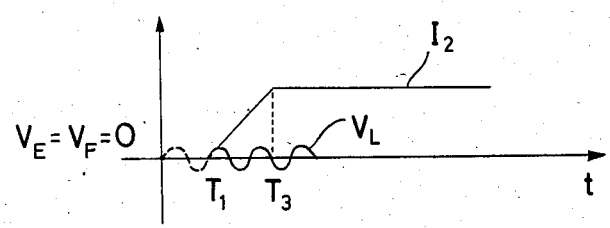
FIG. 7 shows a graph representing the variations in time of voltages and currents in the control circuit of FIG. 6.

The operational result is shown in FIG. 7, which shows how current $I_2$ begins to increase at instant $T_1$ and then reaches operating value at instant $T_2$. At this point the amplifier A switches on, applying to the loudspeaker AP an output voltage $V_L$ corresponding to the audio signal at the input IN.

We claim:

1. Audio amplifier switch-on control circuit in an audio signal generating apparatus, comprising:
   a progressively chargeable capacitor, which charges when said apparatus is turned on; and
   an oscillating circuit which responds to an increase in a load voltage of said capacitor beyond a preset value to progressively shift from a first to a second operating state, in which a switch-on current for switching on the audio amplifier, is produced
   said oscillating circuit including two commutating devices, each of which are controllable by an electrical signal, a first of which being controlled by a load voltage of said capacitor and a second of which being controlled by the state of said first commutating device, said second commutating device causing said oscillating circuit to assume said first operating state after said load voltage reaches said preset value.

2. Control circuit according to claim 1, wherein said oscillating circuit includes two opposed transistors, a first of which being controlled by said second commutating device for placing said oscillating circuit in said first operating state and a second of which being controlled by said first commutating device for the progressive shifting of the oscillating circuit from said first to said second operating state.

3. Control circuit according to claim 2, wherein said second transistor controls a first current generator to generate the audio amplifier switch-on current.

4. Control circuit according to claim 3, wherein said first transistor controls a second current generator to generate a charging current for a capacitor controlling the inverting input of the audio amplifier.

5. Control circuit according to claim 4, wherein said control capacitor is selected so as to achieve a load voltage which prevails over the polarization voltage of the non-inverting input of the audio amplifier for a time longer than the switch-on time which is of the audio amplifier.

6. Audio amplifier switch-on control circuit in an audio signal generating apparatus, comprising:
   a progressively chargeable capacitor which charges when said apparatus is turned on;
   an oscillating circuit which responds to an increase in a load voltage of said capacitor beyond a preset value to progressively shift from a first to a second operating state for the generation of a switch-on current for the audio amplifier; and
   a stand-by switch disposed in parallel with said capacitor.

7. Control circuit according to claim 6, wherein said oscillating circuit includes two commutating devices, each of which are controllable by an electrical signal, a first of which being controlled by the load voltage of said capacitor and a second of which being controlled by the state of said first commutating device, said second commutating device acting on said oscillating circuit to place it in said first operating state after said load voltage reaches said preset value.

8. Control circuit according to claim 7, wherein said oscillating circuit includes two opposed transistors, a first of which is controlled by said second commutating device to place said oscillating circuit in said first operating state, and a second of which is controlled by said first commutating device for said progressive shift of the oscillating circuit from said first to said second operating state.

9. Control circuit according to claim 8, wherein said second transistor controls a first current generator to generate the audio amplifier switch-on current.

10. Control circuit according to claim 9, wherein said first transistor controls a second current generator to generate a charging current for a control capacitor controlling the inverting input of the audio amplifier.

11. Control circuit according to claim 10, wherein said control capacitor is selected so as to achieve a load voltage which prevails over the polarization voltage of the non-inverting input of the audio amplifier for a time longer than the switch-on time of the audio amplifier.

* * * * *